United States Patent
Kraft et al.

(10) Patent No.: US 6,562,547 B2
(45) Date of Patent: May 13, 2003

(54) METHOD FOR PRODUCING STRUCTURE IN CHIPS

(75) Inventors: Jochen Kraft, Bruck/Mur (AT); Martin Schatzmayr, Graz (AT); Hubert Enichlmair, Graz (AT)

(73) Assignee: Austria Mikro Systeme International Aktiengesellschaft, Unterpremstätten (AT)

( * ) Notice: Subject to any disclaimer, the term of this patent is extended or adjusted under 35 U.S.C. 154(b) by 2 days.

(21) Appl. No.: 09/727,389

(22) Filed: Dec. 1, 2000

(65) Prior Publication Data

US 2003/0044723 A1 Mar. 6, 2003

(30) Foreign Application Priority Data

Dec. 3, 1999 (AT) .............................................. 841/99 U

(51) Int. Cl.⁷ .......................... G03F 7/36; H01L 21/331
(52) U.S. Cl. ...................... 430/314; 430/311; 430/312; 430/313; 430/316; 430/319; 438/309; 438/364; 438/369
(58) Field of Search ................................. 430/311, 312, 430/313, 314, 316, 319; 438/309, 364, 369

(56) References Cited

U.S. PATENT DOCUMENTS

| 3,837,856 A | * | 9/1974 | Irving et al. ................ 430/311 |
| 4,481,041 A |   | 11/1984 | Muller ........................ 148/1.5 |
| 4,505,027 A |   | 3/1985 | Schwabe et al. ............... 29/577 |
| 4,581,319 A |   | 4/1986 | Wieder et al. ............... 430/317 |
| 4,745,080 A | * | 5/1988 | Scovell et al. ............... 438/343 |
| 4,755,476 A |   | 7/1988 | Bohm et al. .................. 437/31 |
| 4,758,528 A | * | 7/1988 | Goth et al. .................. 438/514 |
| 4,871,684 A | * | 10/1989 | Glang et al. ................. 438/322 |
| 5,266,505 A | * | 11/1993 | Ahlgren et al. ............... 438/373 |
| 5,798,568 A | * | 8/1998 | Abercrombie et al. ....... 257/758 |

FOREIGN PATENT DOCUMENTS

| JP | 7-142504 | 6/1995 |
| JP | 7-221321 | 8/1995 |
| JP | 10-012871 | 1/1998 |

* cited by examiner

*Primary Examiner*—Mark F. Huff
*Assistant Examiner*—Nicole Barreca
(74) *Attorney, Agent, or Firm*—Kevin E. Joyce

(57) ABSTRACT

A method for producing structures in chips is realized by carrying out a sequence of structuring steps in a self-adjusting manner. By structuring a first auxiliary layer applied on a substrate, a first masking structure is formed after a first masking procedure, which first masking structure has at least one partial region projecting beyond the surface of the substrate. After this, a further structuring step is carried out, for instance, by etching, implantation or CVD, using the previously produced first masking structure as a mask. After this, the first masking structure with a view to forming a second masking structure is inverted by applying at least one second auxiliary layer onto the first masking structure. The thus formed structure is at least partially taken off and the thus denuded first auxiliary layer is selectively removed, whereupon the second masking structure is used as a mask for a further structuring step.

7 Claims, 3 Drawing Sheets

METHOD FOR PRODUCING STRUCTURE IN CHIPS

BACKGROUND OF THE INVENTION

1. Field of the Invention

The invention relates to a method for producing structures in chips, in which a sequence of structuring steps is applied in a self-adjusting manner.

2. Prior Art

In semiconductor manufacturing, several successive structuring steps are usually required to realize semiconductor devices such as, for instance, bipolar transistors. Each individual structuring step is carried out using a mask, a photomask having to be precisely aligned each time. The photomask has to be precisely aligned with the already existing structure, in particular from the second structuring step onwards, which sets high demands on the adjustment precision with structures becoming smaller and smaller in semiconductor manufacturing. At the same time, the process course must be kept as simple as possible in order to keep manufacturing costs as low as possible.

SUMMARY OF THE INVENTION

The present invention aims to provide a simple method for producing structures in chips, by which the alignment of photomasks and the problems of adjustment involved are obviated and which is suitable, in particular, for the production of small structures. The structuring steps, in particular, are to be effected in a self-adjusting manner while guaranteeing a simple process course.

To solve this object, the method according to the invention essentially consists in that, by structuring a first auxiliary layer applied on a substrate, a first masking structure is formed after a first masking procedure, which first masking structure comprises at least one partial region projecting beyond the surface of the substrate, that, after this, a further structuring step is effected, for instance, by etching, implantation or CVD (chemical vapor deposition), using the previously produced first masking structure as a mask, and that, after this, the first masking structure with a view to forming a second masking structure is inverted by applying at least one second auxiliary layer on the first masking structure, the thus formed structure is at least partially taken off and the thus denuded first auxiliary layer is selectively removed, whereupon the second masking structure is used as a mask for a further structuring step. Due to the fact that, by structuring a first auxiliary layer applied on a substrate, a masking structure is formed after a first masking procedure, which masking structure comprises at least one partial region projecting beyond the surface of the substrate, the prerequisite for effecting an inversion of the structure in subsequent structuring steps is provided to the effect that the projecting partial region formed in the first step is taken off and remaining parts each enter into effect as reference elements for self-adjustment. In particular, the prerequisite is provided to enable the previously produced first masking structure to be used as a mask in a subsequent further structuring step carried out, for instance, by etching, implantation of CVD, whereby, following the first masking structure, a further masking structure may be produced by inverting the first masking structure. In doing so, inversion according to the invention is effected in that at least a second auxiliary layer is applied on the first masking structure and an at least partial denudation is effected subsequently. Denudation, in principle, may be realized by planarizing, such planarizing so far having been used only for forming plane surface structures, yet not for inverting a structure as proposed by the invention. By planarization, which, as in correspondence with a preferred further development of the invention, may be realized, for instance, by chemomechanical grinding and/or back-etching, a new structure is formed after the partial removal of material from the more highly located parts of the chip, whereby the first masking structure to the extent is has remained is laid bare again and selectively removed subsequently. The then remaining parts of the second auxiliary layer constitute a second masking structure to be used as a mask for further structuring steps. In the main, that sequence of structuring steps, in which the inversion of a structure using planarizing procedures is effected as the essential step, offers a particularly simple mode of operation for the formation of small structures and, in particular, for instance, for the formation of a large number of semiconductor switching devices or semiconductor devices such as bipolar transistors, on the surfaces of chips so as to ensure a higher component density at a simultaneously elevated precision of the respective layer boundaries.

As already mentioned, denudation preferably is realized by a chemomechanical grinding procedure or by back-etching. If a back-etching procedure is used for planarization in order to invert the structure, it is advantageously proceeded in a manner that a planarizing layer of a material exhibiting good planarizing properties is applied on the first masking structure in addition to the second auxiliary layer. The planarizing layer in more deeply located regions will form thicker layers than above the higher chip portions. If etching is effected uniformly at an ideally equal etching rate for the planarizing layer and the more highly located structures, the topography of the planarized layer surface is imparted on the chip surface. In this manner, it is ensured that the desired inversion of the structure will be achieved at a high precision.

In accordance with the invention, it is advantageously proceeded in a manner that the second auxiliary layer and optionally the planarizing layer will not become planarizing. Non-planarizing etching offers the advantage that the removal of material is effected directionally and, above all, vertically, such non-planarizing etching being of particular advantage especially for the formation of spacers and hence for the purposes of self-adjustment. In the context of the method according to the invention it is, therefore, preferably proceeded in a manner that a layer is applied on the first and/or the second masking structure, which layer is subsequently anisotropically etched in order to form a spacer. By selecting the thickness of the layer applied on the first and/or second masking structure, the precision of adjustment will subsequently be safeguarded because of the remaining spacers having thicknesses substantially corresponding with the thickness of the applied layer, measured in the surface direction.

What is, in principle, decisive in selecting the individual layers is, above all, the criterion that the respective layers to be taken off will be removable at a high selectivity relative to layers not to be taken off. Thus, there should be a good selectivity for the respective layers and auxiliary layers successively applied and relative to the spacer material, respectively. Basically, any usual and customary layers and auxiliary layers such as, for instance, polysilicon, silicon oxide, polymers, silicides such as, e.g., titanium silicide, tungsten silicide or the like, nitrides and metallic layers such as, e.g., titanium layers, aluminum layers or the like may be employed therefor.

Advantageously, it is proceeded in a manner that the first masking structure is comprised of silicon nitride so as to render feasible the subsequent easy denudation of that layer by conventional techniques such as, for instance, by the aid of hot phosphoric acid. In addition, the second masking structure advantageously is formed of silicon oxide and the planarizing layer is prepared of an organic polymer. The removal of organic polymers, may be effected by thermal processes and, for instance, also by plasma etching, layers of silicon oxide or polycrystalline silicon not being altered by such a selective denudation step.

Advantageously, also the second auxiliary layer may be comprised of an organic polymer, the selective removal of that planarizing layer relative to the remaining layers being likewise ensured in that case.

If a carrier substance is used, which does not exhibit any etching selectivity relative to layers that are to be applied subsequently, it is advantageously proceeded in a manner that the substrate itself constitutes a third auxiliary layer comprised of a material exhibiting a good etching selectivity relative to the first and second masking structures.

The segregation of the layers in question may be achieved by conventional processes. Advantageously, a second auxiliary layer is applied by means of a CVD process, whereby the second auxiliary layer also may be comprised of an organic polymer applied by a spin process.

The method according to the invention in a preferred manner is suitable for the formation of bipolar transistors, whereby the electric parameters of the transistor can be set more precisely due to the high precision.

BRIEF DESCRIPTION OF THE DRAWING

In the following, the invention will be explained in more detail by way of exemplary embodiments schematically illustrated in the drawing. Therein.

DETAILED DESCRIPTION OF PREFERRED EMBODIMENTS OF THE INVENTION

Figure 1:
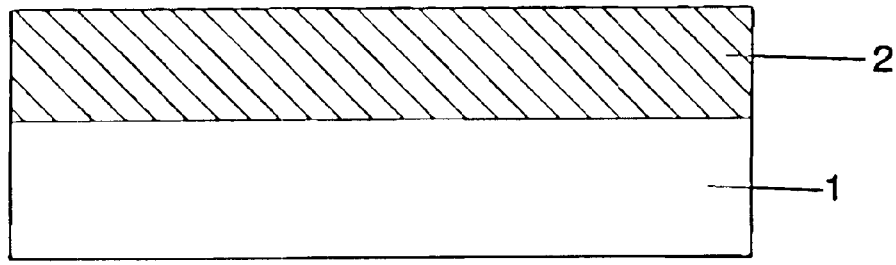
FIGS. 1 to 6 schematically illustrate the method according to the invention.
Figure 2:
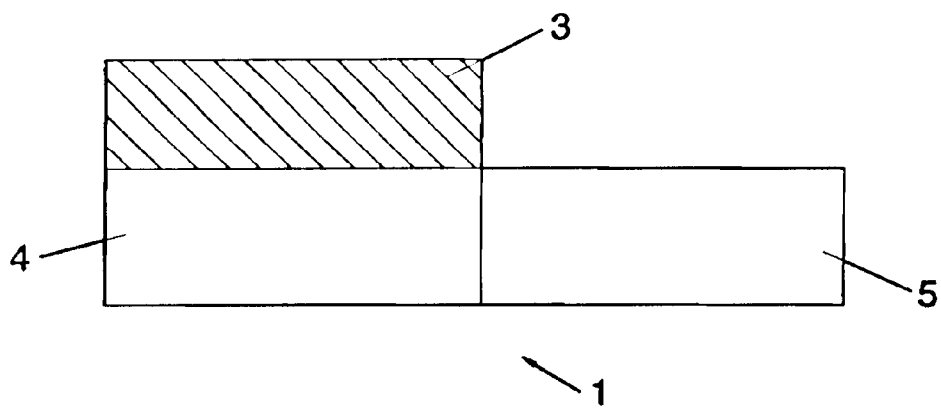
Figure 3:
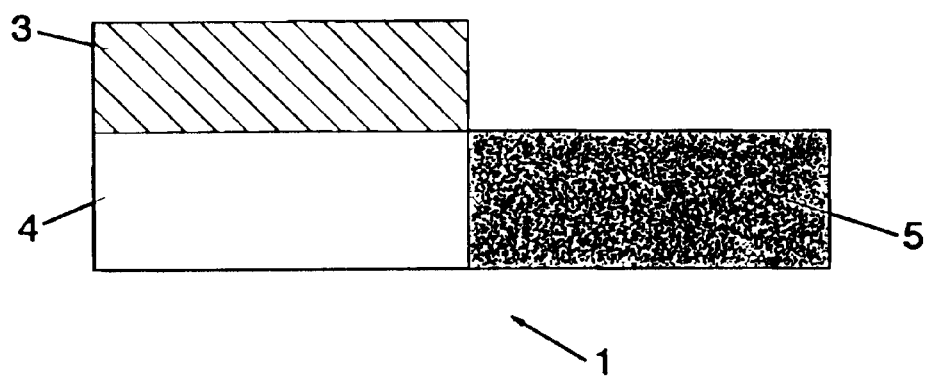
Figure 4:
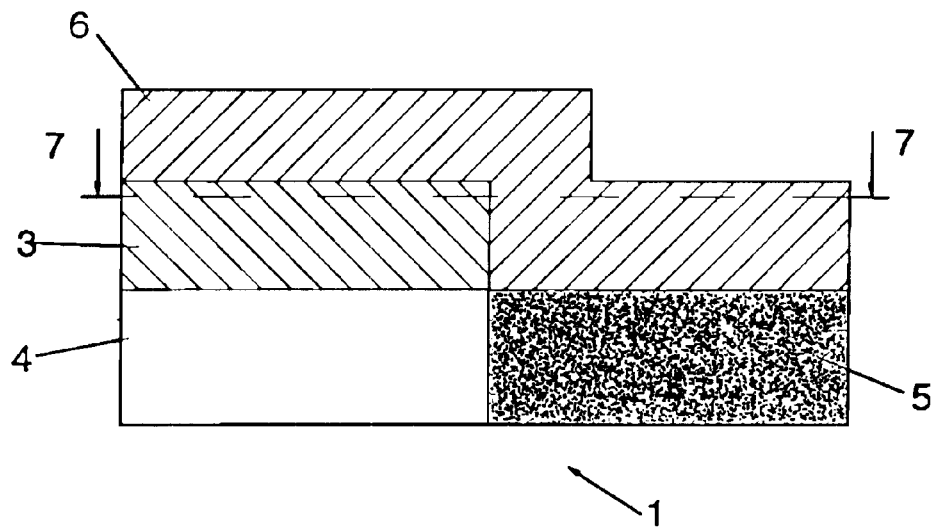
Figure 5:
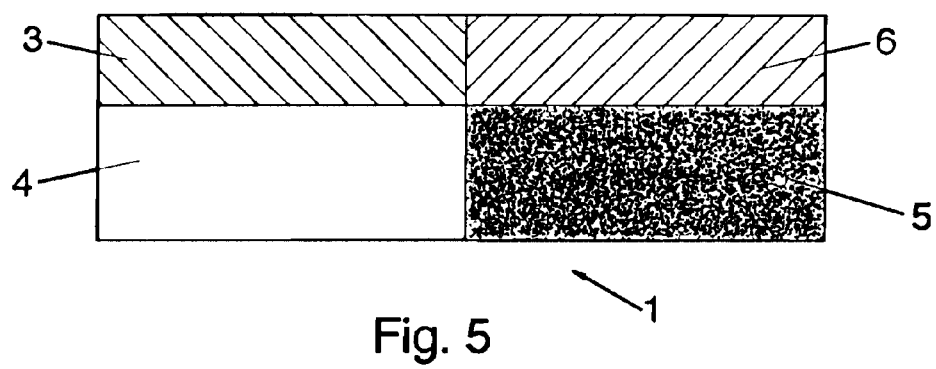
Figure 6:
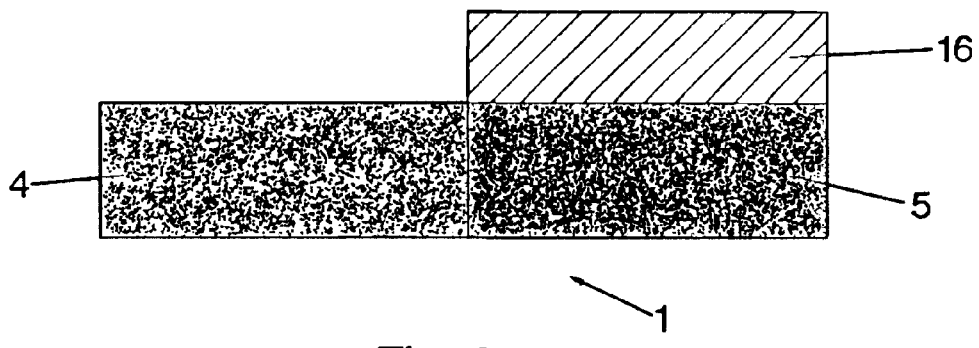

In FIG. 1, a first auxiliary layer 2 is applied on a semiconductor substrate 1. By appropriately masking the first auxiliary layer 2, a first masking structure 3 is formed, which covers a region 4 of the semiconductor substrate 1 and leaves another region 5 of the semiconductor substrate 1 uncovered, as is illustrated in FIG. 2. The unmasked region 5 may subsequently be structured, for instance by implantation, as is illustrated in FIG. 3. The first masking structure 3 in that case must overtop the remaining chip structures to such an extent that these structures can be selectively taken off during the planarizing step following later on. FIG. 4 elucidates how the inversion of the masking structure 3 is being prepared. At first, a second auxiliary layer 6 is applied on the first masking structure 3 as well as on the unmasked region 5 of the semiconductor substrate 1, whereupon all of the material overtopping the plane 7 is taken off by planarizing procedures. This causes the simultaneous denudation of the masking structure 3 and the obtainment of a selective masking of the region 5 of the semiconductor substrate 1 by the secondary auxiliary layer 6, as is illustrated in FIG. 5. The masking structure 3 laid bare may then be selectively removed, for instance, by etching so that only the second auxiliary layer 6 will be left, which corresponds to the inverted structure of the masking 3 and serves as a masking structure for the subsequent structuring of the region 4 of the semiconductor substrate 1. From FIG. 6 it is apparent that the second masking structure 16 precisely covers the already structured region of the semiconductor substrate so as to allow for the selective treatment of the region 4. Hence results that, departing from a first masking structure 3, a second masking structure 16 will be formed by a sequence of simple method steps, said second-masking structure being precisely aligned with said first masking structure.

Figure 7:
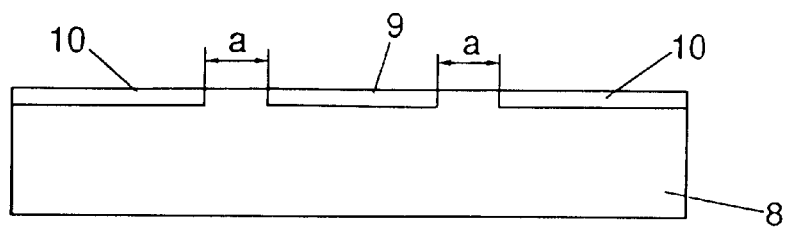
FIGS. 7 to 11 illustrate an application of the method according to the invention for the production of bipolar transistors.
Figure 8:
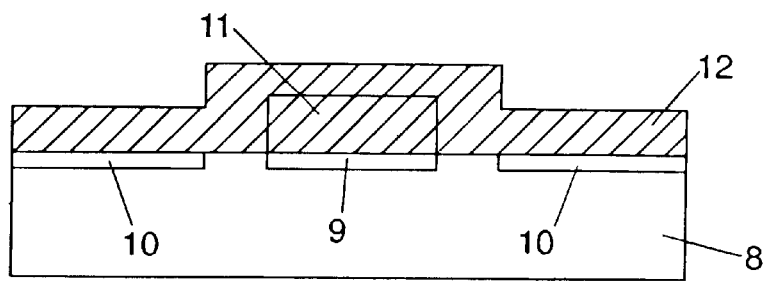
Figure 9:
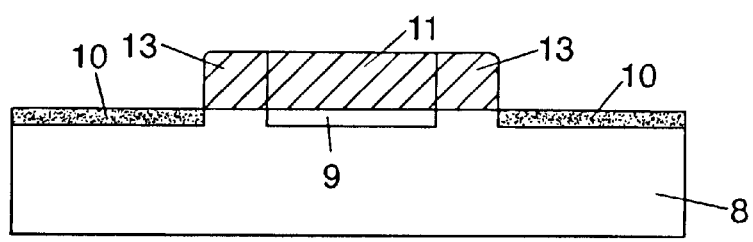
Figure 10:
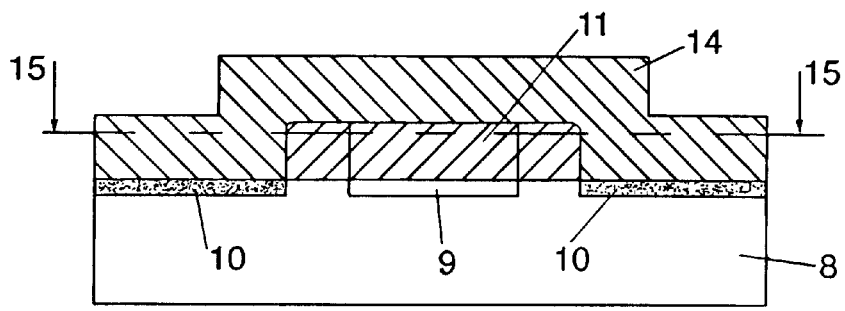
Figure 11:
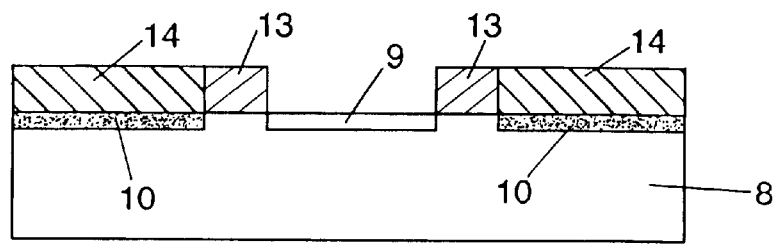

FIGS. 7 to 11 illustrate the application of the method according to the invention in the manufacture of a bipolar transistor. Bipolar transistors involve the problem of an intrinsic base region and an emitter region having to be structured centrally. Lateral of that central region must be structured the base lead (e.g., by an implantation step or by growing on a silicide) while keeping a defined distance. These two structuring steps must be precisely brought into line. Too large a distance means that the resistance of the base lead will increase, too small a distance or overlapping will result in the base region being partially highly doped and the emitter being short-circuited. In FIG. 7, the semiconductor substrate already containing the collector is denoted by 8. Region 9 is the region in which the intrinsic base region is to be formed, extrinsic regions 10 for the base lead are to be formed lateral thereof, each by observing a distance a. To this end, a first masking structure 11 is initially applied, which covers the intrinsic base region, as is illustrated in FIG. 8. After this, a layer 12 of a spacer material is applied, whose thickness exactly corresponds to the distance a provided between the intrinsic and extrinsic bases. Spacers 13 are formed by anisotropically etching the spacer layer 12 so as to enable the subsequent doping of the extrinsic regions, for instance, by the aid of boron, as is illustrated in FIG. 9. After this, an auxiliary layer 14 is applied on the first masking structure 11, the spacers as well as the substrate surface lying bare so as to obtain the structure represented in FIG. 10. The material protruding from the plane 15 is taken off by planarizing procedures so as to uncover the masking structure 11, whereupon the latter is removed by selective etching. The masking structure 14 thus forming, which is shown in FIG. 11, then enables the selective doping of the collector region below the intrinsic base region 9 with a socalled SIC implant (SIC=selective implanted collector). Moreover, it is feasible, by the aid of masking structure 14, to lay bare the region above the intrinsic base, into which the emitter polysilicon is segregated. The principle of structural inversion according to the invention is applicable to both conventional BJTs (bipolar junction transistors) including an implanted base and bipolar transistors including an epitaxially grown base with NPN or PNP polarity.

What we claim is:

1. A method for producing structures in chips to form a bipolar transistor by applying a sequence of structuring steps in a self-adjusting manner, which method comprises the steps of:

providing a substrate (8) having an intrinsic base region (9) on a substrate surface;

forming a first masking structure (11) covering the intrinsic base region (9) and projecting beyond said substrate surface;

performing a first structuring step, in which said first masking structure (11) is used as a mask for doping exposed regions on said substrate surface to form extrinsic base surface regions (10);

applying an auxiliary layer (14) comprised of silicon oxide to cover said first masking structure (11) and said extrinsic base regions (10) so as to obtain a formed structure;

at least partially denuding said formed structure by planarizing the auxiliary layer (14) to expose the first masking structure (11) to form a second masking structure; and using said second masking structure as a mask for a further structuring step in which a collector region in the substrate, below the intrinsic base region, is selectively doped.

2. A method as set forth in claim 1, wherein said first structuring step is carried out by etching, implantation or chemical vapor deposition.

3. A method as set forth in claim 1, wherein said planarizing comprises chemomechanical grinding.

4. A method as set forth in claim 1, further comprising applying a layer of spacer material on said first masking structure and anisotropically etching said spacer material layer so as to form a spacing means.

5. A method as set forth in claim 1, wherein said first masking structure is comprised of silicon nitride.

6. A method as set forth in claim 1, wherein said substrate comprises a further auxiliary layer comprised of a material exhibiting a greater etching selectivity than said first and second masking structures.

7. A method as set forth in claim 1, wherein said auxiliary layer is applied by chemical vapor deposition.

* * * * *